(12) United States Patent
Rofougaran

(10) Patent No.: US 7,890,066 B2
(45) Date of Patent: *Feb. 15, 2011

(54) RADIO FREQUENCY INTEGRATED CIRCUIT ELECTRO-STATIC DISCHARGE CIRCUIT

(75) Inventor: Ahmadreza Rofougaran, Marina Del Ray, CA (US)

(73) Assignee: Broadcom Corporation, Irvine, CA (US)

( * ) Notice: Subject to any disclaimer, the term of this patent is extended or adjusted under 35 U.S.C. 154(b) by 677 days.

This patent is subject to a terminal disclaimer.

(21) Appl. No.: 11/781,816

(22) Filed: Jul. 23, 2007

(65) Prior Publication Data

US 2008/0014878 A1 Jan. 17, 2008

Related U.S. Application Data

(63) Continuation of application No. 11/223,373, filed on Sep. 9, 2005, now Pat. No. 7,248,844, which is a continuation of application No. 10/305,669, filed on Nov. 27, 2002, now Pat. No. 7,010,279.

(51) Int. Cl.
 *H04Q 11/12* (2006.01)
(52) U.S. Cl. .................. 455/117; 455/283; 455/292; 455/217
(58) Field of Classification Search ............... 455/117, 455/78, 211, 292, 280, 338, 552, 86, 83, 455/267, 115.1, 193.1, 121, 80; 333/25, 333/103, 204, 262, 185, 101, 102; 324/72.5, 324/457; 361/113, 56, 119
See application file for complete search history.

(56) References Cited

U.S. PATENT DOCUMENTS

| | | | | |
|---|---|---|---|---|
| 5,923,160 A * | 7/1999 | DeChiaro et al. | ........... | 324/72.5 |
| 6,009,314 A * | 12/1999 | Bjork et al. | .................... | 455/83 |
| 6,751,470 B1 * | 6/2004 | Ella et al. | ................ | 455/552.1 |
| 7,010,279 B2 * | 3/2006 | Rofougaran | ................. | 455/121 |
| 7,248,844 B2 * | 7/2007 | Rofougaran | ................. | 455/117 |
| 7,283,793 B1 * | 10/2007 | McKay | ......................... | 455/83 |
| 2002/0050861 A1 * | 5/2002 | Nguyen et al. | ............... | 330/254 |
| 2003/0231446 A1 * | 12/2003 | Leete | ........................... | 361/56 |
| 2004/0075964 A1 * | 4/2004 | Ker et al. | ..................... | 361/113 |
| 2005/0085200 A1 * | 4/2005 | Toncich | ....................... | 455/121 |
| 2006/0061474 A1 * | 3/2006 | Shanks et al. | ............. | 340/572.1 |

\* cited by examiner

*Primary Examiner*—Tan Trinh
(74) *Attorney, Agent, or Firm*—Garlick Harrison & Markison; Kevin L. Smith

(57) ABSTRACT

The radio frequency integrated circuit (RFIC) electrostatic discharge (ESD) circuit includes an integrated circuit pad and a radio frequency (RF) ESD circuit. The integrated circuit pad provides coupling to an antenna. The RF ESD circuit is coupled to the integrated circuit pad, wherein the RF ESD circuit provides ESD protection at the integrated circuit pad, provides coupling of inbound RF signals from the antenna to low noise amplifier, and provides coupling of outbound RF signals from a power amplifier to the antenna.

8 Claims, 4 Drawing Sheets

RFIC ESD circuit 130

RFIC ESD circuit 100

RFIC ESD circuit 120

RFIC ESD circuit 130

RADIO FREQUENCY INTEGRATED CIRCUIT ELECTRO-STATIC DISCHARGE CIRCUIT

CROSS REFERENCE TO RELATED PATENTS

This patent application claims priority under 35 USC §120 as a continuing application of U.S. patent application Ser. No. 11/223,373, entitled RADIO FREQUENCY INTEGRATED CIRCUIT ELECTRO-STATIC DISCHARGE CIRCUIT, filed Sep. 9, 2005, now issued as U.S. Pat. No. 7,248,844, which is a continuing application of U.S. patent application Ser. No. 10/305,669, entitled RADIO FREQUENCY INTEGRATED CIRCUIT ELECTROSTATIC DISCHARGE CIRCUIT, having a filing date of Nov. 27, 2002, now issued as U.S. Pat. No. 7,010,279, each of which are hereby incorporated herein by reference in their entirety.

TECHNICAL FIELD

This invention relates generally to electrostatic discharge (ESD) protection and more particularly to ESD protection within a radio frequency integrated circuits.

DESCRIPTION OF RELATED ART

As is known, integrated circuits (IC) provide a high degree of functionality in a very small area. Such functionality may include data storage, data processing, radio reception, radio transmission, et cetera. As is also known, integrated circuits include tens-of-thousands to tens-of-millions of transistors (i.e., gates) to implement the desired function or functions. Needless to say, the size of the transistors is very small. For example, a CMOS transistor has a gate oxide thickness of 100 angstroms or less.

As is further known, due to their extremely small size, the gate oxide of CMOS transistors are susceptible to breakdown from static electricity, which is commonly referred to as electrostatic discharge (ESD). If a transistor of an integrated circuit is damaged from ESD while handling of the circuit, the integrated circuit is unusable.

To reduce the risk of damage due to ESD, integrated circuits include ESD protection circuitry. Such ESD protection circuitry includes using silicon-controlled rectifiers (SCR) to clamp ESD voltages and steer related currents away from sensitive transistors, use ESD implanted transistors, which have a higher breakdown voltage, in input/output circuits, use elongated drain structures and larger drain-to-gate spacing, which increase breakdown voltage, and/or other ESD type protection circuitry. While there are numerous ESD protection circuits, none are optimized (i.e., provides desired ESD protection), limit the amount of circuit elements and/or limit the amount of die area, for radio frequency integrated circuits (RFIC).

Therefore, a need exists for a radio frequency integrated circuit ESD protection circuit.

SUMMARY

The present invention is directed to apparatus and methods of operation that are further described in the following Brief Description of the Drawings, the Detailed Description of the Drawings, and the claims. Other features and advantages of the present invention will become apparent from the following detailed description of the invention made with reference to the accompanying drawings.

DETAILED DESCRIPTION OF THE DRAWINGS

Figure 1:
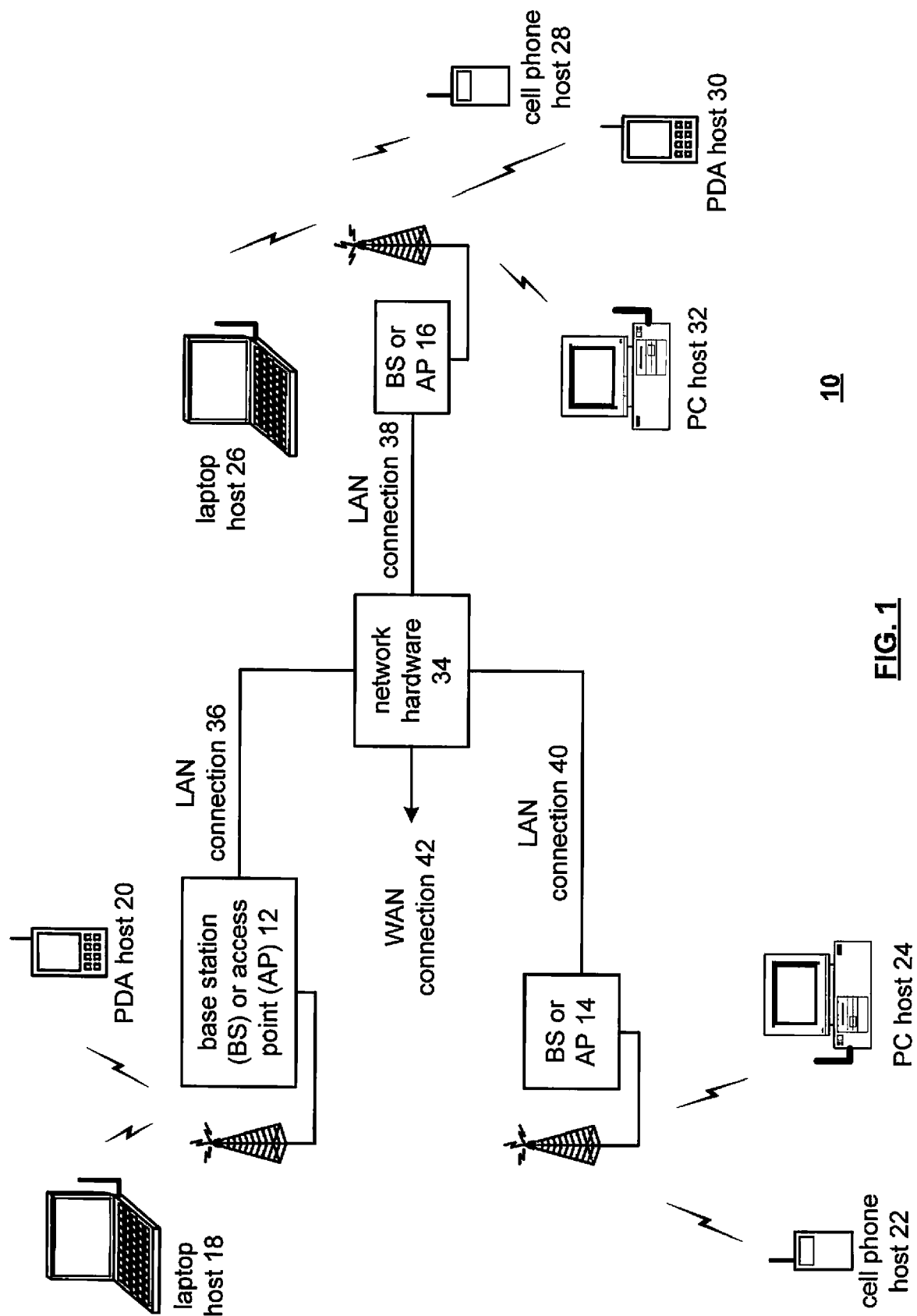
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are coupled to the network hardware 34 via local area network connections 36, 38 and 40. The network hardware 34, which may be a router, switch, bridge, modem, system controller, et cetera, provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
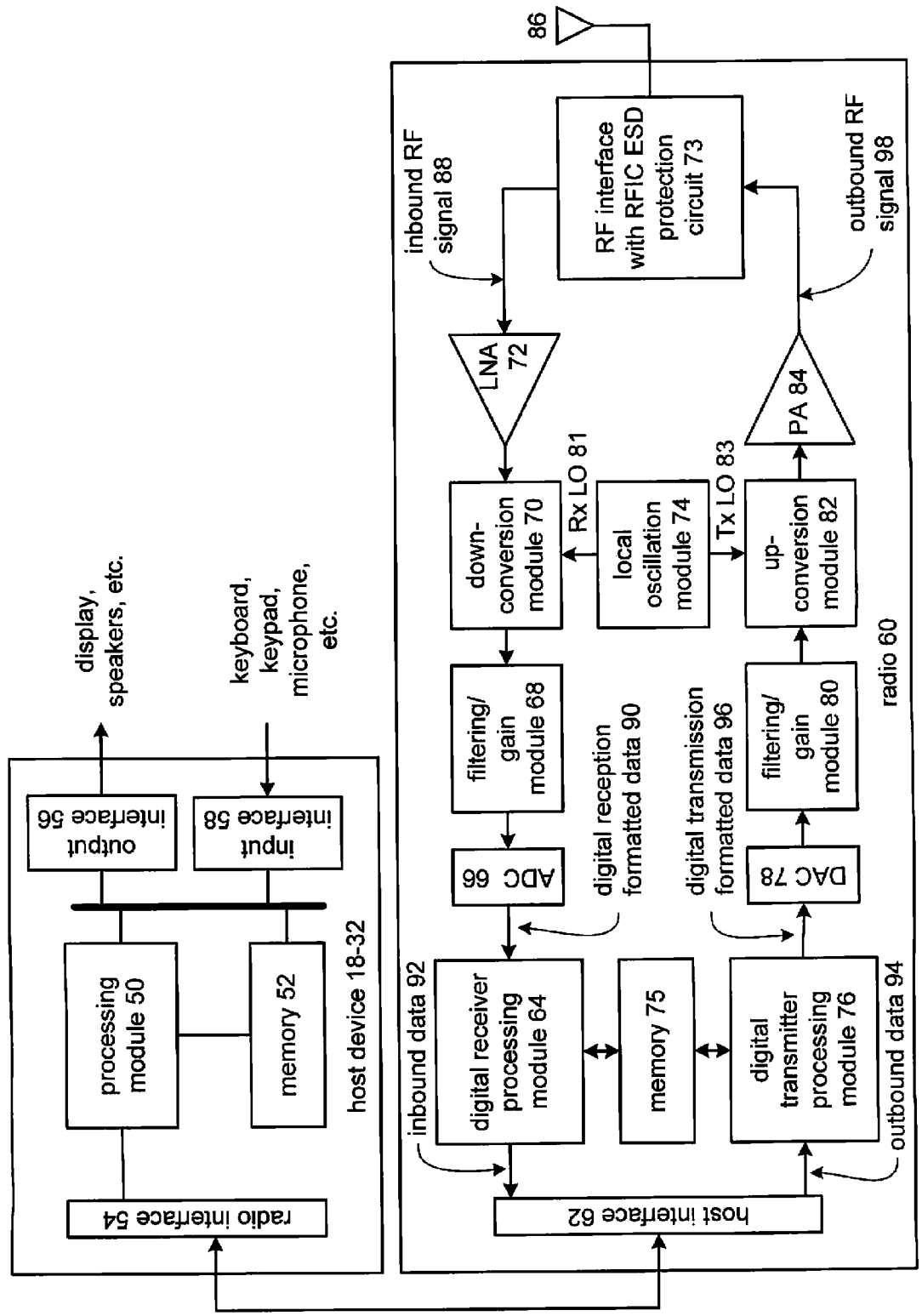
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, an RF interface module with RFIC ESD protection circuit 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the RF interface module 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is provided to the antenna via the RF interface module 73. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the RF interface module 73, which provides the RF signal to low noise amplifier 72. The LNA 72 amplifies the signal 88 to produce an amplified inbound RF signal and provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
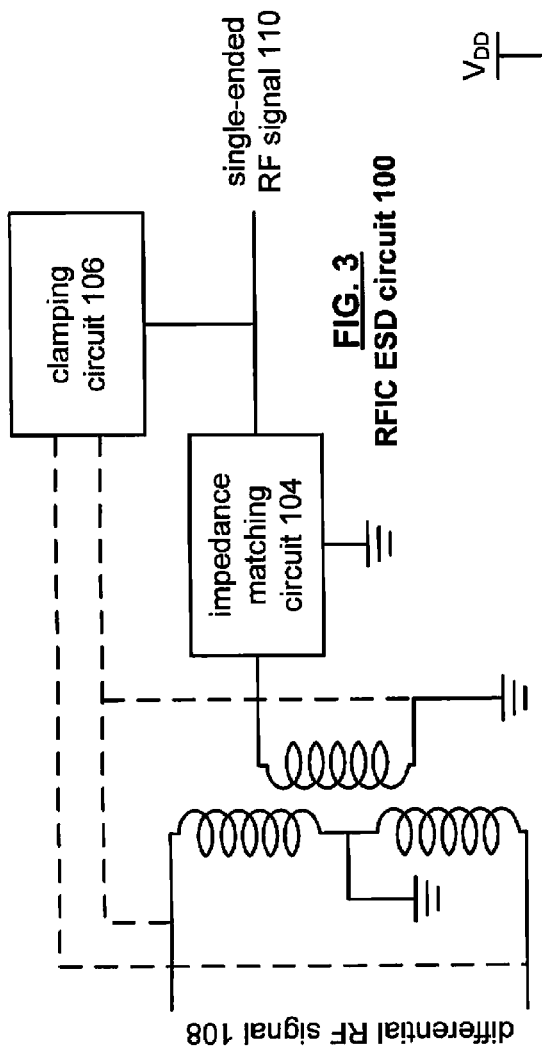
FIG. 3 is a schematic block diagram of an RFIC ESD protection circuit in accordance with the present invention.

FIG. 3 is a schematic block diagram of a radio frequency (RFIC) electrostatic discharge (ESD) protection circuit 100 that may be incorporated in the RF interface module 73. The circuit 100 includes a balun 102, impedance matching circuit 104 and clamping circuit 106. The impedance matching circuit 104 and the impedance of balun 102 match, at frequencies of a radio frequency signal, the impedance of the antenna providing the single-ended RF signal 110. As configured, the transformer balun 102 converts single-ended RF signals 110 into differential RF signals 108 or conversely converts differential RF signals 108 into single-ended RF signals 110.

The clamping circuit 106 may be coupled to the impedance matching circuit 104 and/or to the first winding of the transformer balun 102 to provide ESD protection for the radio frequency integrated circuit. Alternatively, the clamping circuit 106 may be tied to the secondary winding of balun 102.

Figure 4:
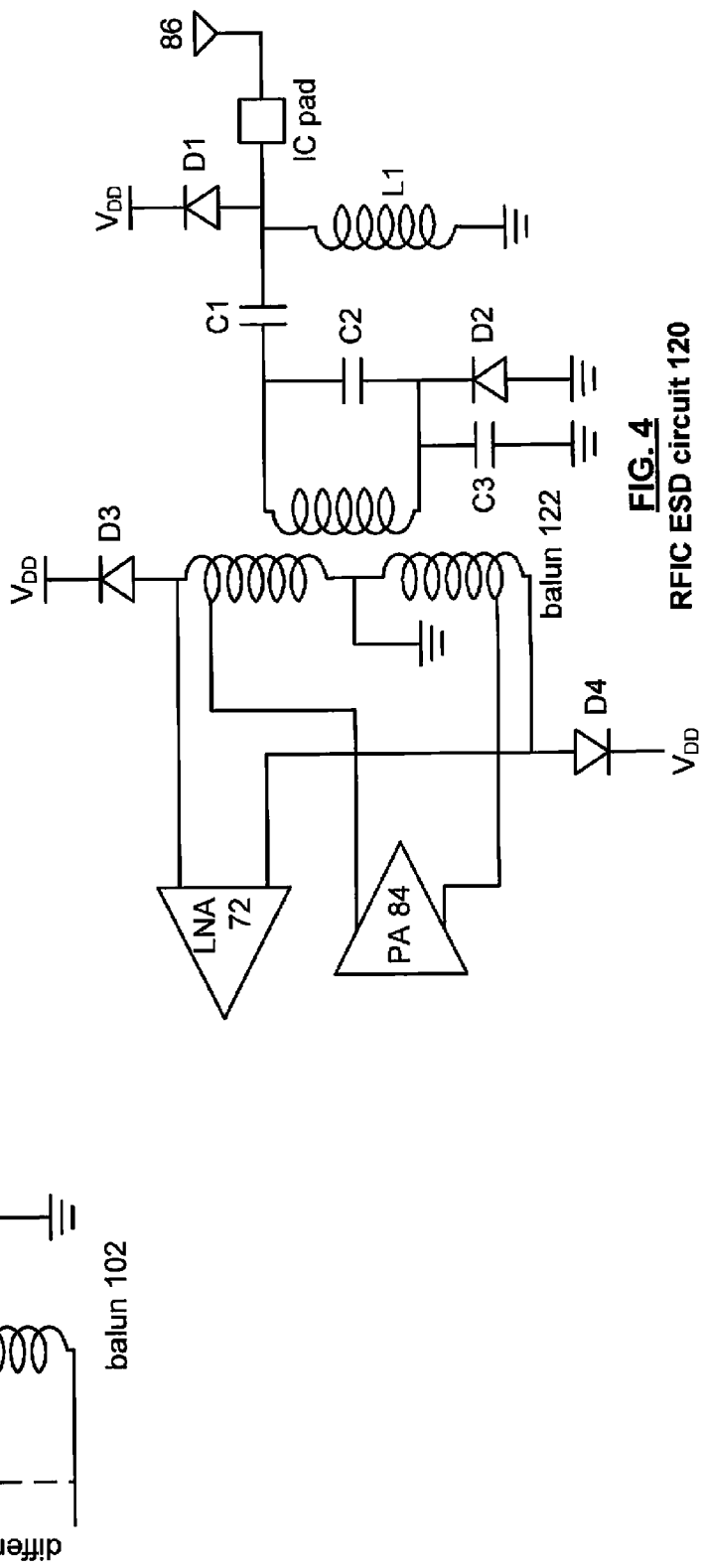
FIG. 4 is a schematic block diagram of another embodiment of an RFIC ESD protection circuit in accordance with the present invention.

FIG. 4 is a schematic block diagram of an alternative radio frequency integrated circuit electrostatic discharge protection circuit 120 that may comprise the RF interface module 73. As shown, an integrated circuit pad of the RFIC is coupled to antenna 86. The balun 122 includes a $1^{st}$ winding coupled to the integrated circuit pad and to capacitor C3, and a $2^{nd}$ winding. The $2^{nd}$ winding includes a $1^{st}$ pair of taps coupled to the input of the low noise amplifier and a $2^{nd}$ pair of taps coupled to the output of power amplifier 84. In this embodiment, capacitor C1 and C2 provide the impedance matching, in combination with the input impedance of balun 122. The clamping circuit may include one or more of diodes D1-D4 and inductor L1. The diodes D1-D4 may be transistors, diodes, and/or silicon-controlled rectifiers.

In one embodiment, the clamping circuit may include only diodes D1 and D2, where, when a static charge is received at the integrated circuit pad, one of the diodes D1 or D3 becomes active and, in combination with capacitors C1, C2 and C3, absorb the energy provided by the static discharge. The absorption of the energy provided by the static discharge may also be dissipated within the transformer balun 122. Further dissipation of the energy may be achieved by including inductor L1. Note that the size of inductor L1 corresponds to the rate of electrostatic discharge but is of such a size that provides negligible effect on processing of single-ended RF signals.

In another configuration of the ESD protection circuit 120 of FIG. 4, diodes D3 and D4 may be included with the omission of D1 and D2. When an ESD event occurs, the voltage corresponding to the ESD event is divided between capacitors C1, C2 and C3. The voltage across capacitor C2 is transposed to the $2^{nd}$ winding of balun 122 and is clamped to $V_{DD}$ via diode D3 and/or D4. Accordingly, the sensitive input transistors of LNA 72 are protected.

Figure 5:
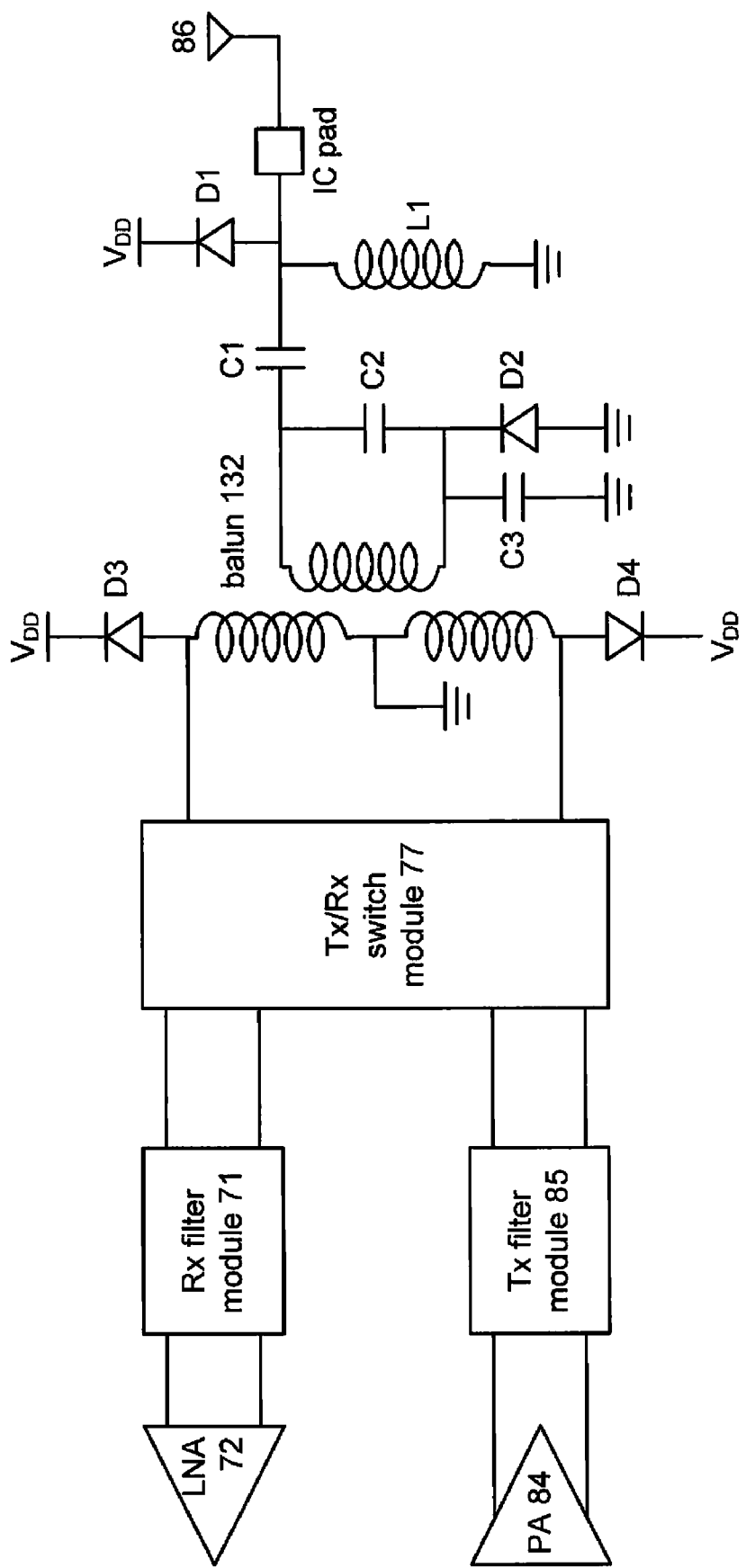
FIG. 5 is a schematic block diagram of another embodiment of an RFIC ESD protection circuit in accordance with the present invention.

FIG. 5 is a schematic block diagram of another embodiment of a RFIC ESD protection circuit 130 that may include the RF interface module 73. In this embodiment, the RFIC ESD protection circuit 130 includes balun 132 that is coupled to a transmit/receive switch module 77. The transmit/receive switch module 77 couples the balun 132 either to the LNA 72 and receiver filter module 71 or couples the balun 132 to the power amplifier 84 and transmit filter module 85. In this embodiment, the protection circuitry includes one or more of diodes D1-D4 and inductor L1. As described with reference to FIG. 4, the protection circuitry may be implemented in a variety of combinations of the elements L1 and D1-D4.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (for example, an item includes, but is not limited to, a component, an element, a circuit, and/or a module) where, for indirect coupling, the intervening item does not modify the information of a signal but may adjust its current level, voltage level, and/or power level. As may further be used herein, inferred coupling (that is, where one element is coupled to another element by inference) includes direct and indirect coupling between two items in the same manner as "coupled to". As may even further be used herein, the term "operable to" indicates that an item includes one or more of power connections, input(s), output(s), et cetera, to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that a first signal has a greater magnitude than a second signal, a favorable comparison may be achieved when the magnitude of the first signal is greater than that of the second signal or when the magnitude of the second signal is less than that of the first signal.

The preceding discussion has presented an electrostatic discharge protection circuit for use in a radio frequency integrated circuit. By utilizing existing components of the radio frequency integrated circuit as part of the ESD protection circuit, ESD protection for radio frequency integrated circuits is optimized. As one of average skill in the art will appreciate, other embodiments may be derived from the teaching of the present invention, without deviating from the scope of the claims.

What is claimed is:

1. A radio frequency integrated circuit (RFIC) electrostatic discharge (ESD) circuit comprises:
    an integrated circuit pad for coupling to an antenna;
    an impedance matching circuit coupled to the integrated circuit pad, wherein the impedance matching circuit at least partially establishes an input impedance of the integrated circuit pad to substantially match an impedance of the antenna; and
    a clamping circuit coupled to the integrated circuit pad, wherein the clamping circuit in combination with the impedance matching circuit provides ESD protection at the integrated circuit pad.

2. The RFIC ESD circuit of claim 1, wherein the clamping circuit comprises:
    a reversed biased diode element coupled to the integrated circuit pad and a positive supply of the RFIC.

3. The RFIC ESD circuit of claim 1, wherein the clamping circuit comprises:
    a first reversed biased diode element coupled to the integrated circuit pad and a positive supply of the RFIC; and
    a second reversed biased diode element AC coupled to the integrated circuit pad and a return of the RFIC.

4. The RFIC ESD circuit of claim 1, wherein the impedance matching circuit comprises:
    an inductor coupled between the integrated circuit pad and a return of the RFIC;
    a first capacitor coupled in series with the integrated circuit pad; and
    a second capacitor coupled to the first capacitor and an AC ground of the RFIC.

5. The RFIC ESD circuit of claim 4, wherein the impedance matching circuit further comprises:
   a third capacitor coupled to the second capacitor and the return of the RFIC to provide the AC ground.

6. An electro-static discharge (ESD) circuit to provide ESD protection to a radio frequency integrated circuit (RFIC), the ESD circuit comprises:
   an ESD module coupled to an integrated circuit pad of the RFIC, the integrated circuit pad for coupling to an antenna, wherein the ESD module includes:
      an ESD circuit coupled to the integrated circuit pad, wherein the ESD circuit includes:
         a balun coupled to transpose a single-ended radio frequency (RF) signal and a differential RF signal, wherein the balun includes a first winding and a second winding, wherein the first winding provides the single-ended RF signal and is coupled to the integrated circuit pad, and wherein the second winding provides the differential RF signal;
         an impedance matching circuit coupled to first winding, wherein impedance of the impedance matching circuit in conjunction with an impedance of the balun at frequencies in a range of the RF substantially match an impedance of the antenna; and
         a clamping circuit coupled to the balun and the impedance matching circuit, wherein the clamping circuit in combination with at least the impedance matching circuit provides ESD protection for at least one of a receiver section and a transmitter section of the RFIC.

7. The ESD circuit of claim 6, wherein the clamping circuit comprises:
   a reversed biased diode element coupled to a corresponding the integrated circuit pad and a positive supply of the RFIC.

8. The ESD circuit of claim 6, wherein the clamping circuit comprises:
   a first reversed biased diode element coupled to the integrated circuit pad and a positive supply of the RFIC; and
   a second reversed biased diode element AC coupled to the integrated circuit pad and a return of the RFIC.

* * * * *

UNITED STATES PATENT AND TRADEMARK OFFICE
CERTIFICATE OF CORRECTION

PATENT NO. : 7,890,066 B2  Page 1 of 1
APPLICATION NO. : 11/781816
DATED : February 15, 2011
INVENTOR(S) : Ahmadreza Rofougaran It is certified that error appears in the above-identified patent and that said Letters Patent is hereby corrected as shown below:

Col. 8, lines 12-13, in Claim 7: after "a corresponding" delete "the"

Signed and Sealed this
Fourteenth Day of August, 2012

David J. Kappos
*Director of the United States Patent and Trademark Office*